United States Patent
Suzuki

(10) Patent No.: US 10,636,619 B2
(45) Date of Patent: Apr. 28, 2020

(54) CHARGED PARTICLE BEAM APPARATUS, AND METHOD AND PROGRAM FOR LIMITING STAGE DRIVING RANGE THEREOF

(71) Applicant: HITACHI HIGH-TECH SCIENCE CORPORATION, Tokyo (JP)

(72) Inventor: Hiroyuki Suzuki, Tokyo (JP)

(73) Assignee: HITACHI HIGH-TECH SCIENCE CORPORATION, Tokyo (JP)

( * ) Notice: Subject to any disclaimer, the term of this patent is extended or adjusted under 35 U.S.C. 154(b) by 0 days.

(21) Appl. No.: 16/279,646

(22) Filed: Feb. 19, 2019

(65) Prior Publication Data

US 2019/0259568 A1 Aug. 22, 2019

(30) Foreign Application Priority Data

Feb. 20, 2018 (JP) ................................ 2018-027764

(51) Int. Cl.

| | |
|---|---|
| *H01J 37/20* | (2006.01) |
| *H01J 37/08* | (2006.01) |
| *H01J 37/06* | (2006.01) |
| *H01J 37/16* | (2006.01) |
| *H01J 37/244* | (2006.01) |

(52) U.S. Cl.
CPC .............. *H01J 37/20* (2013.01); *H01J 37/06* (2013.01); *H01J 37/08* (2013.01); *H01J 37/16* (2013.01); *H01J 37/244* (2013.01); *H01J 2237/20278* (2013.01); *H01J 2237/2448* (2013.01)

(58) Field of Classification Search
CPC .. H01J 37/20; H01J 37/06; H01J 37/08; H01J 37/16; H01J 37/244; H01J 2237/20278; H01J 2237/2448
See application file for complete search history.

(56) References Cited

FOREIGN PATENT DOCUMENTS

JP 2008270072 A 11/2008

*Primary Examiner* — Nicole M Ippolito
*Assistant Examiner* — Hanway Chang
(74) *Attorney, Agent, or Firm* — Holland & Hart LLP

(57) ABSTRACT

Disclosed is a charged particle beam apparatus including a stage supporting a sample holder; a stage driving mechanism; a sample chamber; a focused ion beam column; an electron beam column; a detector detecting secondary ions or secondary electrons generated from the sample; a reading unit reading identification information attached to the sample holder; a memory unit storing holder shape information indicating a correspondence relationship between the identification information and a shape of the sample holder, and design information that is shape information of an internal structure of the sample chamber; and a stage driving range limiting unit limiting a driving range of the stage supporting the sample holder on the basis of the shape of the sample holder that is acquired from the identification information read by the reading unit and the holder shape information, and on the basis of a shape of the internal structure.

8 Claims, 5 Drawing Sheets

CHARGED PARTICLE BEAM APPARATUS, AND METHOD AND PROGRAM FOR LIMITING STAGE DRIVING RANGE THEREOF

CROSS REFERENCE TO RELATED APPLICATION(S)

This application claims the benefit of Korean Patent Application No. 2018-027764, filed Feb. 20, 2018, which is hereby incorporated by reference in its entirety into this application.

BACKGROUND OF THE INVENTION

1. Technical Field

The present invention relates to a charged particle beam apparatus, and a method and a program for limiting a stage driving range of the charged particle beam apparatus.

2. Description of the Related Art

In general, for example, when observing the inside of a sample having a three-dimensional structure such as a semiconductor device, the sample is cut by using a focused ion beam (FIB) to form an arbitrary observation cross-section of the three-dimensional structure, and this cross-section is observed with an electron microscope. In such an observation cross-section, for example, when it is desired to observe a defective portion of the sample, the position thereof is specified by a defect inspection apparatus or the like, and cross-section processing is performed on the basis of acquired position information.

Furthermore, in the related art, there is known a charged particle beam apparatus, which can predict interference with a sample before operating a stage, irrespective of the kind of the sample, thus preventing the interference and can remarkably reduce the burden on an operator (see, for example, Patent Document 1). In the charged particle beam apparatus disclosed in Patent Document 1, three-dimensional information of the sample is acquired, and whether the interference with the sample takes place is determined in advance by simulation, and a determination result is notified to the operator.

Documents of Related Art (Patent Document 1) Japanese Patent Application Publication No. 2008-270072

SUMMARY OF THE INVENTION

However, in the charged particle beam apparatus disclosed in Patent Document 1, the shape of a sample and the shape of each component (irradiation system, detector, gas injector, etc.) are taken into consideration in order to determine the presence or absence of interference, whereas the shape of a sample holder on which the sample is placed is not considered. The shape of the sample holder on which the sample is placed may differ in each sample holder. For this reason, in the charged particle beam apparatus disclosed in Patent Document 1, there is a possibility that the sample holder on which the sample is placed and each component interfere with each other.

Accordingly, the present invention has been made keeping in mind the above problem occurring in the related art, and an objective of the present invention is to provide a charged particle beam apparatus capable of suppressing interference between a sample holder on which a sample is placed and an inner structure of a sample chamber, and a method and a program for limiting a stage driving range of the charged particle beam apparatus.

In order to accomplish the above objective, according to an aspect of the present invention, there is provided a charged particle beam apparatus, including: a stage supporting a sample holder on which a sample is placed; a stage driving mechanism driving the stage; a sample chamber in which the stage is accommodated; a focused ion beam column irradiating the sample with a focused ion beam; an electron beam column irradiating the sample with an electron beam; a detector detecting secondary ions or secondary electrons generated from the sample by irradiation with the focused ion beam or the electron beam; a reading unit reading identification information attached to the sample holder; a memory unit storing holder shape information indicating a correspondence between the identification information and a shape of the sample holder, and design information that is shape information of an internal structure of the sample chamber; and a stage driving range limiting unit limiting a driving range of the stage supporting the sample holder, based on the shape of the sample holder which is acquired from the identification information read by the reading unit and the holder shape information and based on a shape of the internal structure.

The charged particle beam apparatus according to the aspect of the present invention may further include: an auxiliary sample chamber in which the reading unit is disposed; a transfer unit transferring the sample holder from the auxiliary sample chamber into the sample chamber; and a transfer control device controlling transfer of the sample holder by the transfer unit based on a result of reading the identification information by the reading unit, wherein the reading unit may read the identification information attached to the sample holder located in the auxiliary sample chamber.

In the charged particle beam apparatus according to the aspect of the present invention, the transfer unit may not transfer the sample holder located in the auxiliary sample chamber into the sample chamber when the reading unit does not successfully read the identification information attached to the sample holder located in the auxiliary sample chamber.

In the charged particle beam apparatus according to the aspect of the present invention, the stage driving range limiting unit may limit the driving range of the stage to a range in which all of the sample, the sample holder, the stage, and the stage driving mechanism do not interfere with the internal structure.

The charged particle beam apparatus according to the aspect of the present invention may further include: an operator information acquiring unit acquiring operator information for identifying an operator of the charged particle beam apparatus; and a history managing unit matching the operator information acquired by the operator information acquiring unit and the identification information read by the reading unit and storing a matching result in the memory unit.

The charged particle beam apparatus according to the aspect of the present invention may further include an operator working efficiency calculating unit calculating working efficiency for each operator of the charged particle beam apparatus on the basis of history information.

According to another aspect of the present invention, there is provided a method of limiting a stage driving range of a charged particle beam apparatus that includes a stage supporting a sample holder on which a sample is placed, a stage driving mechanism driving the stage, a sample chamber in which the stage is accommodated, a focused ion beam column irradiating the sample with a focused ion beam, an electron beam column radiating the sample with an electron beam, and a detector detecting secondary ions or secondary electrons generated from the sample by irradiation with the focused ion beam or the electron beam, the method including: reading identification information attached to the sample holder; storing holder shape information indicating a correspondence between the identification information and a shape of the sample holder, and design information that is shape information of an internal structure of the sample chamber; and limiting a driving range of the stage supporting the sample holder based on the identification information read in the step of reading of the identification information, the shape of the sample holder acquired from the holder shape information, and a shape of the internal structure.

According to still another aspect of the present invention, there is provided a program executed in a computer of a charged particle beam apparatus that includes a stage supporting a sample holder on which a sample is placed, a stage driving mechanism driving the stage, a sample chamber in which the stage is accommodated, a focused ion beam column irradiating the sample with a focused ion beam, an electron beam column irradiating the sample with an electron beam, and a detector detecting secondary ions or secondary electrons generated from the sample by irradiation with the focused ion beam or the electron beam, and including: reading identification information attached to the sample holder; storing holder shape information indicating correspondence between the identification information and a shape of the sample holder, and design information that is shape information of an internal structure of the sample chamber; and limiting a driving range of the stage supporting the sample holder based on the identification information read in the step of reading of the identification information, the shape of the sample holder acquired from the holder shape information, and a shape of the internal structure.

According to the present invention, it is possible to provide the charged particle beam apparatus capable of suppressing the interference between the sample holder on which the sample is placed and the internal structure of the sample chamber, and the method and the program for limiting the stage driving range of the charged particle beam apparatus.

BRIEF DESCRIPTION OF THE DRAWINGS

The above and other objectives, features and advantages of the present invention will be more clearly understood from the following detailed description taken in conjunction with the accompanying drawings, in which.

DESCRIPTION OF THE PREFERRED EMBODIMENTS

Hereinafter, embodiments of a charged particle beam apparatus, and a method and a program for limiting a stage driving range of the charged particle beam apparatus will be described with reference to the accompanying drawings.

First Embodiment

Figure 1:
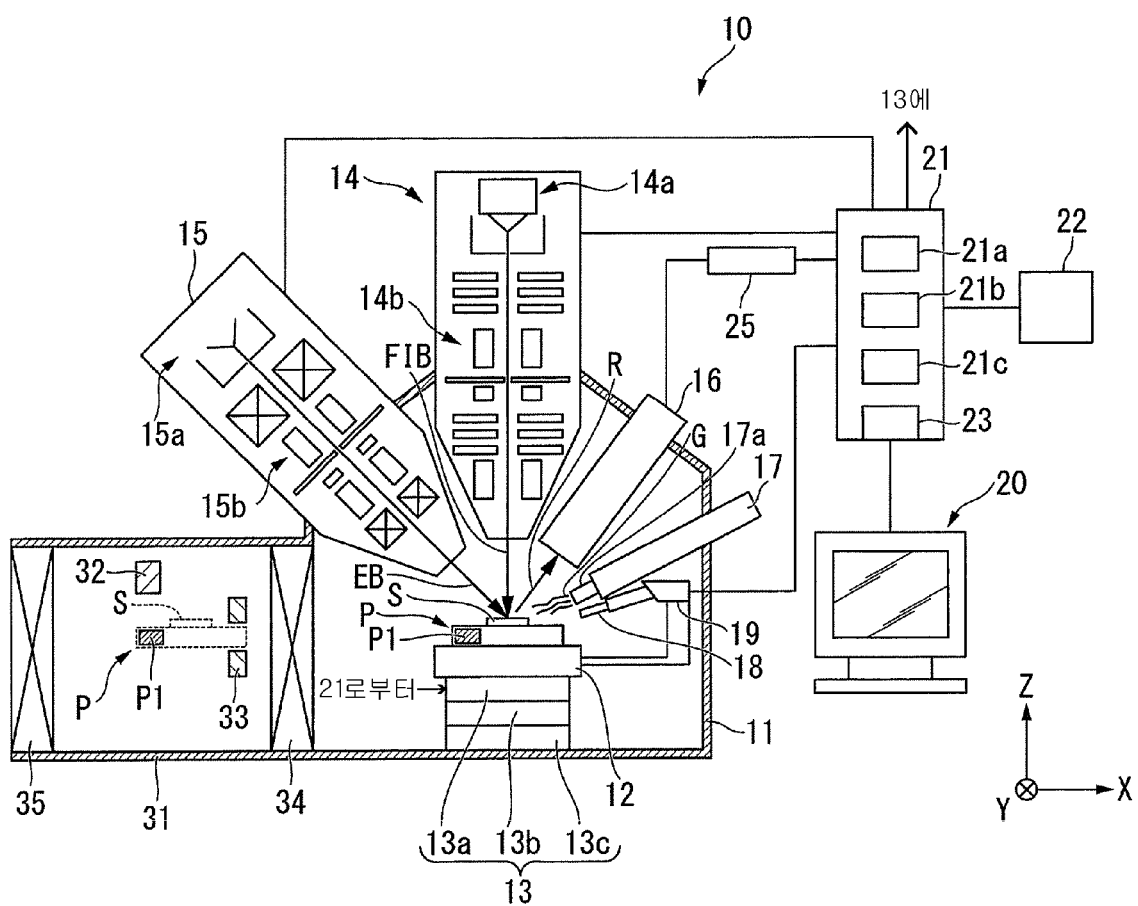
FIG. 1 is a view showing an example of a schematic of a charged particle beam apparatus according to a first embodiment.

FIG. 1 is a view showing an example of a schematic of a charged particle beam apparatus 10 according to a first embodiment.

In the example shown in FIG. 1, the charged particle beam apparatus 10 includes, for example, a sample chamber 11, a stage 12, a stage driving mechanism 13, a focused ion beam column 14, an electron beam column 15, a detector 16, a gas supply unit 17, a needle 18, a needle driving mechanism 19, a display device 20, a computer 21, an input device 22, an image forming unit 25, an auxiliary sample chamber 31, a reading unit 32, a transfer unit 33, an airtight door 34, and an airtight door 35.

The sample chamber 11 is configured to be able to maintain the inside thereof in a vacuum state by an exhaust device (not shown). The stage 12 is accommodated in the sample chamber 11 and supports a sample holder P on which the sample S is placed. The stage driving mechanism 13 is accommodated in the sample chamber 11 and drives the stage 12. The stage driving mechanism 13 includes, for example, a moving mechanism 13a, a tilting mechanism 13b, and a rotating mechanism 13c. The moving mechanism 13a moves the stage 12 linearly. The tilting mechanism 13b rotates the stage 12 about the axis included in the horizontal plane including the X axis and the Y axis and tilts the stage 12. The rotating mechanism 13c rotates the stage 12 about the Z axis (vertical axis).

In the example shown in FIG. 1, the focused ion beam column (focused ion beam optics) 14 irradiates a sample S with a focused ion beam FIB. The focused ion beam column 14 includes an ion source 14a and ion optics 14b. The ion source 14a generates ions. The ion source 14a is, for example, a liquid metal ion source using liquid gallium or the like, a plasma ion source, a gas field ion source, or the like. The ion optics 14b condenses and deflects the ions emitted from the ion source 14a. The ion optics 14b includes, for example, a first electrostatic lens such as a condenser lens, an electrostatic deflector, and a second electrostatic lens such as an objective lens, and the like.

The electron beam column (electron beam optics) 15 irradiates the sample S with an electron beam EB. The electron beam column 15 includes an electron source 15a and electron optics 15b. The electron source 15a generates electrons. The electron optics 15b condenses and deflects the electrons emitted from the electron source 15a. The electron optics 15b includes, for example, an electromagnetic lens, a deflector, and the like.

In the example shown in FIG. 1, the focused ion beam column 14 extends in a Z-axis direction and the electron beam column 15 is inclined with respect to the Z-axis. In another example, the focused ion beam column 14 may be inclined with respect to the Z axis and the electron beam column 15 may extend in the Z axis direction.

In the example shown in FIG. 1, the detector 16 detects secondary charged particles R (secondary ions or secondary electrons) generated from the sample S by irradiation with the focused ion beam FIB and outputs a signal indicating a detection result to the image forming unit 25. The gas supply unit 17 supplies gas G to the surface of the sample S. The gas supply unit 17 is provided with a gas injection nozzle 17a injecting the gas G. The needle 18 takes, for example, a micro-sample piece from the sample S for transfer. The needle driving mechanism 19 drives the needle 18.

The display device 20 displays, for example, an image formed on the basis of a signal output from the image forming unit 25. Furthermore, the display device 20 displays, for example, a screen for performing operations such as enlarging, reducing, moving, and rotating an image. Furthermore, the display device 20 displays, for example, a screen for performing various settings such as mode selection, processing setting, and the like in sequence control.

The computer 21 controls the stage driving mechanism 13. Furthermore, the computer 21 controls the focused ion beam column 14 and controls an irradiation position, an irradiation condition, and the like of the focused ion beam FIB. The computer 21 controls the electron beam column 15 and controls an irradiation position, an irradiation condition, and the like of the electron beam EB. Furthermore, the computer 21 controls the gas supply unit 17. Furthermore, the computer 21 controls the needle driving mechanism 19.

The computer 21 includes a memory unit 21a, a comparison unit 21b, an update unit 21c, and a display control device 23. The memory unit 21a is constituted by, for example, a storage memory, a hard disk, and the like and stores holder shape information, design information, and the like that will be described later. The comparison unit 21b is constituted by, for example, a CPU, a cache memory, and the like and determines (compares), in a later-described stage driving range limiting process, whether the sample holder P on which the sample S is placed and an internal structure of the sample chamber 11 interfere with each other. The update unit 21c is constituted by, for example, a CPU, a storage memory, and the like and updates the holder shape information, the design information, history information, and the like that are stored by the memory unit 21a. The display control device 23 is constituted by, for example, an IC chip and the like and performs control to display an image or the like formed by the image forming unit 25 on the display device 20.

In the example shown in FIG. 1, the input device 22 receives an input of an operation by an operator of the charged particle beam apparatus 10. The input device 22 is, for example, a mouse, a keyboard, a touch pad, or the like. The image forming unit 25 forms an image of the surface, a cross-section, or the like of the sample S on the basis of a signal output from the detector 16 and outputs data of the image to the computer 21.

In other words, the charged particle beam apparatus 10 performs processing of the sample S in such a manner that the focused ion beam column 14 is caused to radiate the sample S with the focused ion beam FIB. The charged particle beam apparatus 10 performs observation of the sample S in such a manner that the electron beam column 15 is caused to radiate the sample S with the electron beam EB, and the detector 16 detects the secondary charged particles R.

In the example shown in FIG. 1, the auxiliary sample chamber 31 is configured to be able to maintain the inside thereof in a vacuum state by an exhaust device, like the sample chamber 11. In the auxiliary sample chamber 31, the sample S and the sample holder P before being transferred into the sample chamber 11 are accommodated. The sample S and the sample holder P are transferred from the outside of the charged particle beam apparatus 10 into the auxiliary sample chamber 31 through the airtight door 35. Furthermore, the sample S and the sample holder P are transferred by the transfer unit 33 from the auxiliary sample chamber 31 into the sample chamber 11 through the airtight door 34.

In the example shown in FIG. 1, identification information P1 identifying the sample holder P is attached to the sample holder P. The identification information P1 is, for example, information represented by a barcode, information stored in an integrated circuit (IC) tag, or the like. The barcode is not limited to one-dimensional arrangement, but may be two-dimensional. The reading unit 32 reads the identification information P1 attached to the sample holder P. The reading unit 32 is, for example, a barcode reader, an IC tag reader, or the like. The reading unit 32 is disposed in the auxiliary sample chamber 31. In other words, the reading unit 32 reads the identification information P1 attached to the sample holder P located in the auxiliary sample chamber 31.

In the example shown in FIG. 1, in the charged particle beam apparatus 10, a sample holder P having multiple different shapes may be used. Herein, in the charged particle beam apparatus 10, the memory unit 21a of the computer 21 stores the holder shape information indicating a correspondence relationship between the identification information P1 and the shape of the sample holder P. Furthermore, the memory unit 21a stores the design information, which is shape information of the internal structure of the sample chamber 11. The internal structure of the sample chamber 11 includes, for example, the stage 12, the stage driving mechanism 13, a portion of the focused ion beam column 14 that protrudes inside of the sample chamber 11, a portion of the electron beam column 15 that protrudes inside of the sample chamber 11, a portion of the detector 16 that protrudes inside of the sample chamber 11, and a portion of the gas supply unit 17 that protrudes inside of the sample chamber 11, and the like.

In the example shown in FIG. 1, when the sample S and the sample holder P are transferred by the transfer unit 33 from the auxiliary sample chamber 31 into the sample chamber 11, when the sample and the sample holder P are moved by the stage driving mechanism 13, and the like, efforts to suppress the interference of the sample S and the sample holder P with the internal structure of the sample chamber 11 are performed by the computer 21 and the like.

Figure 2:
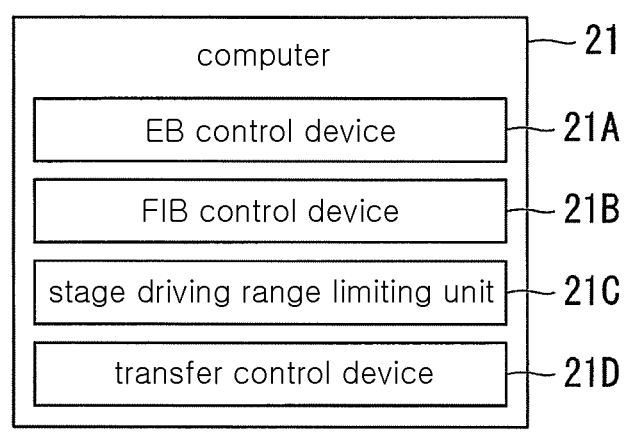
FIG. 2 is a view showing an example of a schematic functional block of a computer of the charged particle beam apparatus according to the first embodiment.

FIG. 2 is a view showing an example of a schematic functional block of the computer 21 of the charged particle beam apparatus 10 according to the first embodiment.

In the example shown in FIG. 2, the computer 21 includes an EB control device 21A, an FIB control device 21B, a stage driving range limiting unit 21C, and a transfer control device 21D.

The EB control device 21A controls the irradiation position, the irradiation condition, and the like of the electron beam EB described above. The FIB control device 21B controls the irradiation position, the irradiation condition, and the like of the focused ion beam FIB described above.

The stage driving range limiting unit 21C controls the stage driving mechanism 13 and performs control to limit a driving range of the stage 12 such that the sample S and the sample holder P are prevented from interfering with the internal structure of the sample chamber 11. Specifically explained, the stage driving range limiting unit 21C limits the driving range of the stage 12 on the basis of the shape of the sample holder P that is acquired from the identification information P1 read by the reading unit 32 and the holder shape information, and on the basis of the shape of the internal structure.

Specifically explained, the stage driving range limiter 21C limits the driving range of the stage 12 to a range in which the sample S does not interfere with the internal structure of the sample chamber 11, a range in which the sample holder P does not interfere with the internal structure of the sample chamber 11, a range in which the stage 12 moved linearly or rotated by the stage driving mechanism 13 does not interfere with the internal structure of the sample chamber 11, and a range in which the stage driving mechanism 13 moving linearly, tilting, or rotating the stage 12 does not interfere with the internal structure of the sample chamber 11. In other words, the stage driving range limiting unit 21C limits the driving range of the stage 12 to a range including each option on the basis of application information.

The transfer control device 21D controls transfer of the sample S and the sample holder P by the transfer unit 33 on the basis of a result of reading the identification information P1 by the reading unit 32. Specifically explained, when the reading unit 32 does not successfully read the identification information P1 attached to the sample holder P located in the auxiliary sample chamber 31, the transfer control device 21D does not permit the transfer unit 33 to transfer the sample S and the sample holder P from the auxiliary sample chamber 31 into the sample chamber 11. In other words, when the reading unit 32 does not successfully read the identification information P1 attached to the sample holder P located in the auxiliary sample chamber 31, the transfer unit 33 does not transfer the sample S and the sample holder P that are located in the auxiliary sample chamber 31 into the sample chamber 11.

Figure 3:
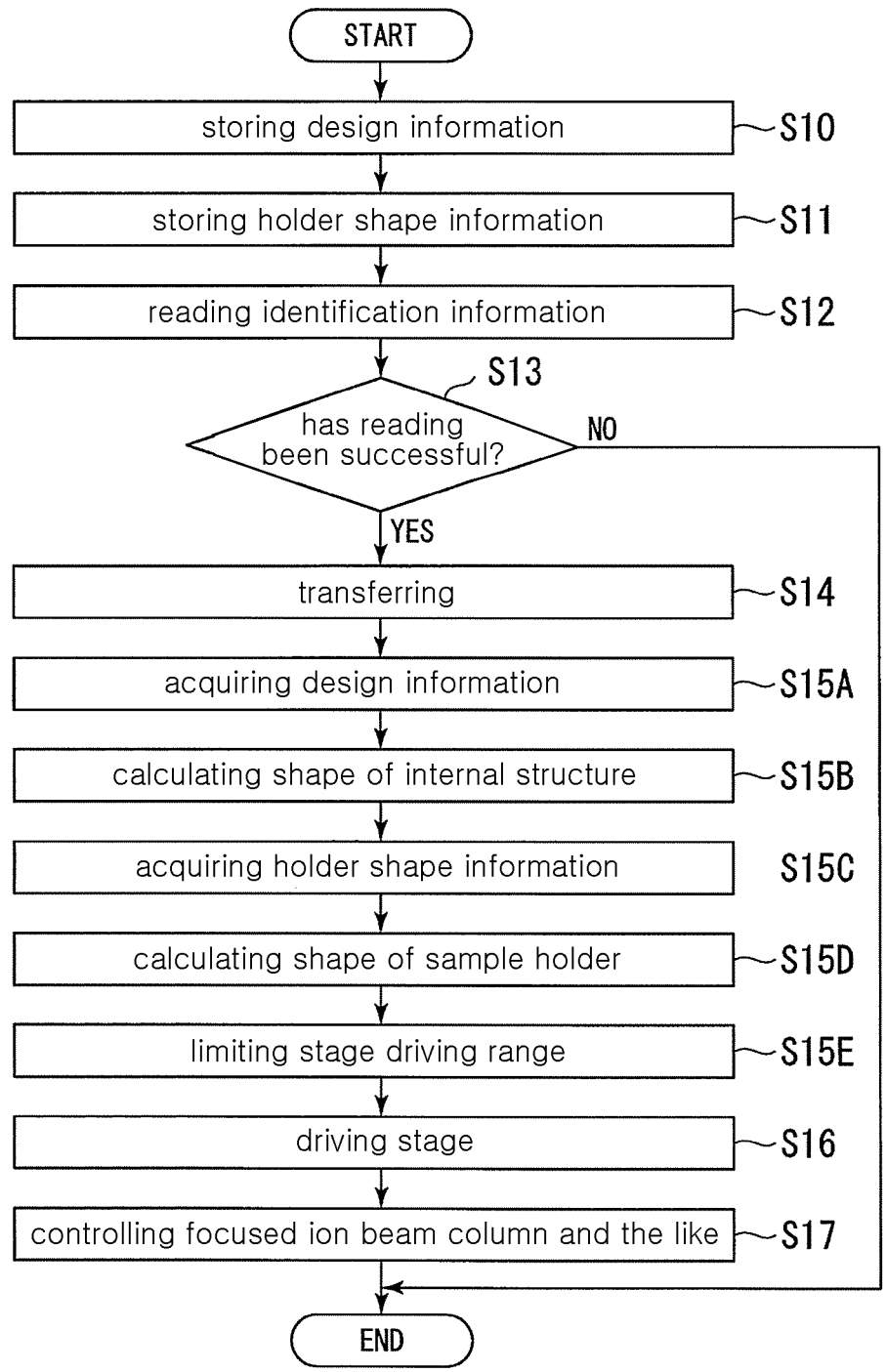
FIG. 3 is a flowchart showing an example of a stage driving range limiting process executed in the charged particle beam apparatus according to the first embodiment.

FIG. 3 is a flowchart showing an example of a stage driving range limiting process executed in the charged particle beam apparatus 10 according to the first embodiment.

In the example shown in FIG. 3, in step S10, the memory unit 21a stores the design information, which is the shape information of the internal structure of the sample chamber 11.

In step S11, the memory unit 21a stores the holder shape information indicating the correspondence relationship between the identification information P1 and the shape of the sample holder P.

Then, in step S12, the reading unit 32 reads, for example, the identification information P1 attached to the sample holder P located in the auxiliary sample chamber 31.

Then, in step S13, the transfer control device 21D determines whether the reading unit 32 has successfully read the identification information P1. When the reading unit 32 has successfully read the identification information P1, the transfer control device 21D permits the transfer unit 33 to transfer the sample S and the sample holder P from the auxiliary sample chamber 31 into the sample chamber 11, and step S14 is entered. On the other hand, when the reading unit 32 has not successfully read the identification information P1, the transfer control device 21D prohibits the transfer unit 33 from transferring the sample S and the sample holder P from the auxiliary sample chamber 31 into the sample chamber 11, and a routine shown in FIG. 3 is ended.

In step S14, the transfer unit 33 transfers the sample S and the sample holder P from the auxiliary sample chamber 31 into the sample chamber 11.

Then, in step S15A, the stage driving range limiting unit 21C acquires the design information stored in the memory unit 21a.

In step S15B, the stage driving range limiting unit 21C calculates the shape of the internal structure of the sample chamber 11 on the basis of the design information acquired in step S15A.

In step S15C, the stage driving range limiting unit 21C acquires the holder shape information stored in the memory unit 21a.

Then, in step S15D, the stage driving range limiting unit 21C calculates the shape of the sample holder P on the basis of the identification information P1 read in step S12 and the holder shape information acquired in step S15C.

Then, in step S15E, the stage driving range limiting unit 21C limits the driving range of the stage 12 on the basis of the shape of the sample holder P calculated in step S15D and the shape of the internal structure of the sample chamber 11 calculated in step S15B.

Then, in step S16, the stage driving mechanism 13 drives the stage 12.

Then, in step S17, the computer 21 controls any one of the focused ion beam column 14, the electron beam column 15, the gas supply unit 17, and the needle driving mechanism 19.

Summary of First Embodiment

In the charged particle beam apparatus 10 according to the first embodiment, as described above, the stage driving range limiting unit 21C limits the driving range of the stage 12 on the basis of the shape of the sample holder P and the shape of the inner structure of the sample chamber 11. Due to this, it is possible to suppress the interference between the sample holder P on which the sample S is placed and the internal structure of the sample chamber 11.

In the charged particle beam apparatus 10 according to the first embodiment, as described above, the transfer control device 21D controls transfer of the sample holder P by the transfer unit 33 on the basis of the result of reading the identification information P1 by the reading unit 32. Specifically explained, when the reading unit 32 does not successfully read the identification information P1 attached to the sample holder P located in the auxiliary sample chamber 31, the transfer unit 33 does not transfer the sample holder P located in the auxiliary sample chamber 31 into the sample chamber 11. Due to this, it is possible to suppress a possibility that the sample holder P, whose shape cannot be ascertained, is transferred into the sample chamber 11.

Furthermore, in the charged particle beam apparatus 10 according to the first embodiment, as described above, the stage driving range limiting unit 21C limits the driving range of the stage to a range in which all of the sample S, the sample holder P, the stage 12, and the stage driving mechanism 13 (i.e., components that are moved in cooperation with the driving of the stage 12) do not interfere with the internal structure of the sample chamber 11. Due to this, even when the stage driving mechanism 13 moves linearly, tilts, or rotates the stage 12, it is possible to suppress the interference between any one of the sample S, the sample holder P, the stage 12, and the stage driving mechanism 13 and the internal structure of the sample chamber 11.

In other words, in the charged particle beam apparatus 10 according to the first embodiment, species information of the sample holder P is managed in the charged particle beam apparatus 10. Furthermore, the driving range of the stage 12 is additionally limited on the basis of the information of the sample holder P. The barcode or the like is used to identify the species of the sample holder P and is attached to the sample holder P as the identification information P1. A system for recognizing the species of the sample holder P is mounted in the charged particle beam apparatus 10. The driving range of the stage 12 is limited on the basis of information of the shape of the internal structure of the sample chamber 11 and information of the shape of the sample holder P. In addition to these pieces of information, application information such as, for example, information of tilting of the stage 12 is used for limiting the driving range of the stage 12. As a result, in the charged particle beam apparatus 10, limiting the driving of the stage 12 on the basis of the pre-built interference information in the range including each options. In other words, in the charged particle beam apparatus 10 according to the first embodiment, the interference between any one of the sample S, the sample holder P, the stage 12, and the stage driving mechanism 13 and the internal structure of the sample chamber 11 can be suppressed, with or without skill of the operator.

Second Embodiment

Hereinafter, a second embodiment of a charged particle beam apparatus, and a method and a program for limiting a stage driving range of the charged particle beam apparatus will be described with reference to the accompanying drawings.

The charged particle beam apparatus 10 according to the second embodiment is configured in the same manner as the charged particle beam apparatus 10 according to the first embodiment except for the following points. Thus, the charged particle beam apparatus 10 according to the second embodiment can have the same effects as those of the charged particle beam apparatus 10 according to the first embodiment described above, except for the following points.

Figure 4:
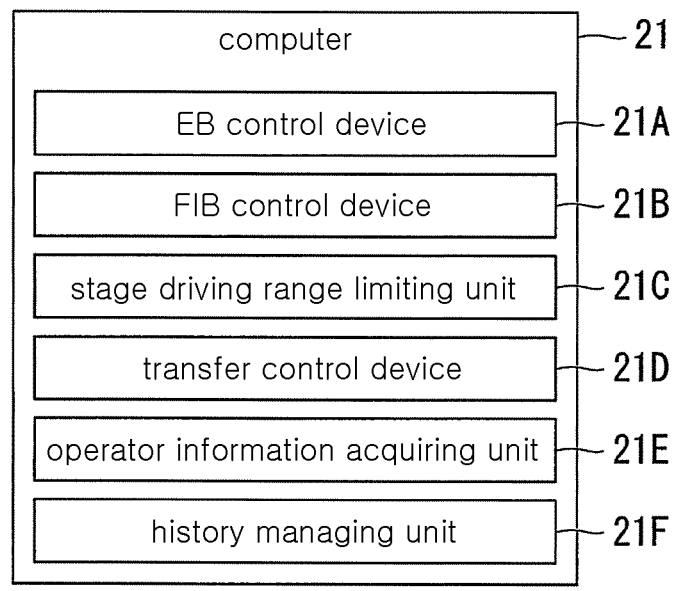
FIG. 4 is a view showing an example of a schematic functional block of a computer of a charged particle beam apparatus according to a second embodiment.

FIG. 4 is a view showing an example of a schematic functional block of a computer 21 of the charged particle beam apparatus 10 according to the second embodiment.

In the example shown in FIG. 2, the computer 21 does not include an operator information acquiring unit 21E and a history managing unit 21F. However, in the example shown in FIG. 4, the computer 21 includes the operator information acquiring unit 21E and the history managing unit 21F.

In the example shown in FIG. 4, the operator of the charged particle beam apparatus 10 has an operator identification tag (not shown) including operator information for identifying the operator of the charged particle beam apparatus 10. An operator information reading unit (not shown) reads the operator information stored in the operator identification tag.

The operator information acquiring unit 21E acquires the operator information read by the operator information reading unit. The operator information includes, for example, information for identifying each operator, history information of the sample holder P used by the operator, history information of an application used by the operator, information of a recipe registered by the operator, operator-customized information of the display device 20, and the like.

The history managing unit 21F matches the operator information acquired by the operator information acquiring unit 21E and the identification information P1 read by the reading unit 32 and stores a matching result in the memory unit 21a.

Figure 5:
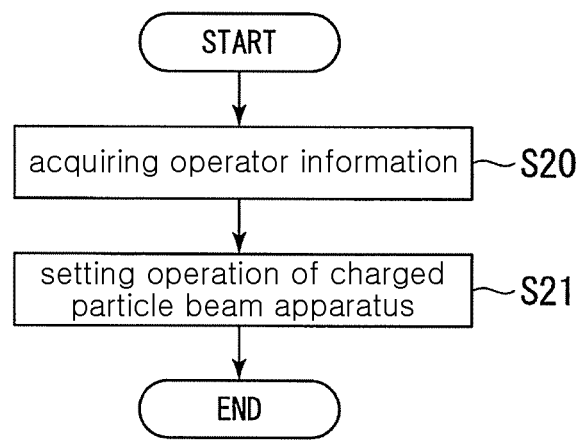
FIG. 5 is a flowchart showing an example of a stage driving range limiting process executed in the charged particle beam apparatus according to the second embodiment.

FIG. 5 is a flowchart showing an example of a stage driving range limiting process executed in the charged particle beam apparatus 10 according to the second embodiment.

The process shown in FIG. 5 is executed, for example, in the charged particle beam apparatus 10 according to the second embodiment before the process shown in FIG. 3 is executed.

In the example shown in FIG. 5, in step S20, the operator information acquiring unit 21E acquires the operator information read by the operator information reading unit.

Then, in step S21, the computer 21 sets operation of the charged particle beam apparatus 10 by using the information for identifying each operator, the history information of the sample holder P used by the operator, the history information of the application used by the operator, the information of the recipe registered by the operator, the operator-customized information of the display device 20, and the like.

In other words, in the charged particle beam apparatus 10 according to the second embodiment, the operator identification tag is used. The operator information included in the operator identification tag (for example, the history information of the sample holder P used by the operator, the history information of the application used by the operator, the information of the recipe registered by the operator, and the operator-customized information of the display device 20) is managed. Due to this, in the charged particle beam apparatus 10 according to the second embodiment, it is possible to easily perform setting for each operator.

Third Embodiment

Hereinafter, a third embodiment of a charged particle beam apparatus, and a method and a program for limiting a stage driving range of the charged particle beam apparatus will be described with reference to the accompanying drawings.

The charged particle beam apparatus 10 according to the third embodiment is configured in the same manner as the charged particle beam apparatus 10 according to the second embodiment except for the following points. Thus, the charged particle beam apparatus 10 according to the third embodiment can have the same effects as those of the charged particle beam apparatus 10 according to the second embodiment described above, except for the following points.

Figure 6:
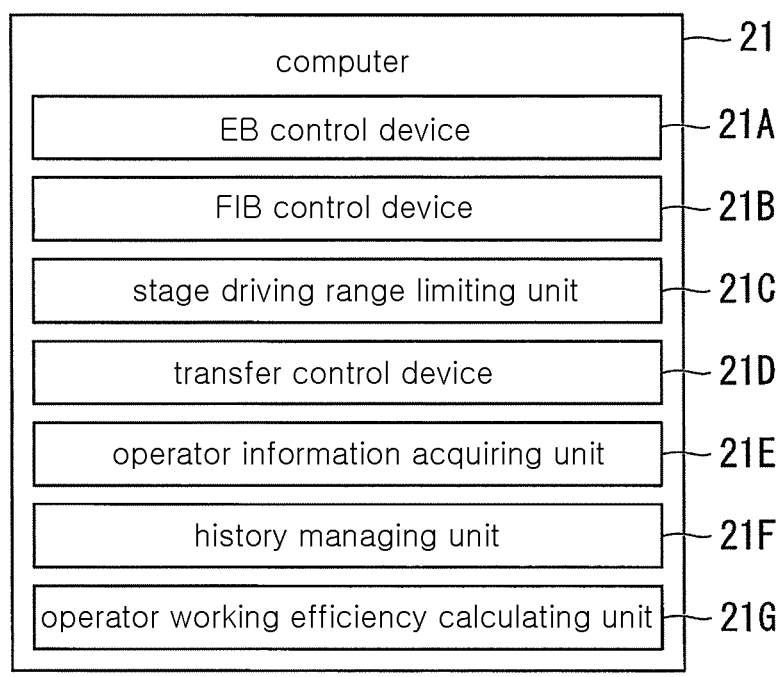
FIG. 6 is a view showing an example of a schematic functional block of a computer of a charged particle beam apparatus according to a third embodiment.

FIG. 6 is a view showing an example of a schematic functional block of a computer 21 of the charged particle beam apparatus 10 according to the third embodiment.

In the example shown in FIG. 4, the computer 21 does not include an operator working efficiency calculating unit 21G. However, in the example shown in FIG. 6, the computer 21 includes the operator working efficiency calculating unit 21G.

In the example shown in FIG. 6, the operator working efficiency calculating unit 21G calculates working efficiency for each operator of the charged particle beam apparatus 10 on the basis of the above-described various kinds of history information.

The operator working efficiency calculating unit 21G calculates, for example, after the process shown in FIG. 3 and the process shown in FIG. 5 are executed, the working efficiency for each operator of the charged particle beam apparatus 10 and builds a management log for each operator.

In other words, in the charged particle beam apparatus 10 according to the third embodiment, because the management log for each operator is built, it is possible to find the difference of the working efficiency for each operator on the basis of a recipe creation situation for each operator. This makes it possible for the charged particle beam apparatus 10 to perform a proposal for improving working efficiency for each operator.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. For instance, the respective configurations described in the above embodiments of the present invention can be used by those skilled in the art in a manner of being combined with one another.

The all or some of the functions of each part provided in the charged particle beam apparatus 10 in the above-described embodiments may be implemented by recording a program for implementing these functions on a computer-readable recording medium, and allowing a computer system to read and execute the program recorded on the recording medium. Furthermore, the term "computer system" as used herein includes an OS and hardware such as peripheral devices.

Furthermore, the term "computer-readable recording medium" refers to a memory unit such as a portable medium a flexible disk, a magneto-optical disk, a ROM, a CD-ROM, and a hard disk built in a computer system. Furthermore, the term "computer-readable recording medium" may include a medium that stores a program dynamically for a short period of time, such as a communication line used when the program is transmitted through a network such as the Internet or a communication line such as a telephone line. Additionally, in this case, the computer-readable recording medium may include a medium that stores a program for a predetermined period of time, such as a volatile memory provided in the computer system serving as a server or client.

Furthermore, the program may be a program for implementing some of the aforementioned functions described above or may be a program that can implement the aforementioned functions in combination with a program already recorded on the computer system.

What is claimed is:

1. A charged particle beam apparatus, comprising:
    a stage supporting a sample holder on which a sample is placed;
    a stage driving mechanism driving the stage:
    a sample chamber in which the stage is accommodated;
    a focused ion beam column irradiating the sample with a focused ion beam;
    an electron beam column irradiating the sample with an electron beam;
    a detector detecting secondary ions or secondary electrons generated from the sample by irradiation with the focused ion beam or the electron beam;
    a reading unit reading identification information attached to the sample holder;
    a memory unit storing holder shape information indicating correspondence between the identification information and a shape of the sample holder, and design information that is shape information of an internal structure of the sample chamber; and
    a stage driving range limiting unit limiting a driving range of the stage supporting the sample holder, based on the shape of the sample holder which is acquired from the identification information read by the reading unit and the holder shape information and based on a shape of the internal structure.

2. The charged particle beam apparatus of claim 1, further comprising:
    an auxiliary sample chamber in which the reading unit is disposed;
    a transfer unit transferring the sample holder from the auxiliary sample chamber into the sample chamber; and
    a transfer control device controlling transfer of the sample holder by the transfer unit, based on a result of reading the identification information by the reading unit, wherein
    the reading unit reads the identification information attached to the sample holder located in the auxiliary sample chamber.

3. The charged particle beam apparatus of claim 2, wherein the transfer unit does not transfer the sample holder located in the auxiliary sample chamber into the sample chamber when the reading unit does not successfully read the identification information attached to the sample holder located in the auxiliary sample chamber.

4. The charged particle beam apparatus of claim 1, wherein the stage driving range limiting unit limits the driving range of the stage to a range in which all of the sample, the sample holder, the stage, and the stage driving mechanism do not interfere with the internal structure.

5. The charged particle beam apparatus of claim 1, further comprising:
    an operator information acquiring unit acquiring operator information for identifying an operator of the charged particle beam apparatus; and
    a history managing unit matching the operator information acquired by the operator information acquiring unit and the identification information read by the reading unit and storing a matching result in the memory unit.

6. The charged particle beam apparatus of claim 5, further comprising:
    an operator work efficiency calculating unit calculating work efficiency of each operator of the charged particle beam apparatus, based on history information.

7. A method of limiting a stage driving range of a charged particle beam apparatus, which includes a stage supporting a sample holder on which a sample is placed, a stage driving mechanism driving the stage, a sample chamber in which the stage is accommodated, a focused ion beam column irradiating the sample with a focused ion beam, an electron beam column irradiating the sample with an electron beam, and a detector detecting secondary ions or secondary electrons generated from the sample by irradiation with the focused ion beam or the electron beam, the method comprising:
    reading identification information attached to the sample holder;
    storing holder shape information indicating correspondence between the identification information and a shape of the sample holder, and design information that is shape information of an internal structure of the sample chamber; and
    limiting a driving range of the stage supporting the sample holder, based on the identification information read in the step of reading of the identification information, the shape of the sample holder acquired from the holder shape information, and a shape of the internal structure.

8. A program executed in a computer of a charged particle beam apparatus that includes a stage supporting a sample holder on which a sample is placed, a stage driving mechanism driving the stage, a sample chamber in which the stage is accommodated, a focused ion beam column irradiating the sample with a focused ion beam, an electron beam column irradiating the sample with an electron beam, and a detector detecting secondary ions or secondary electrons generated from the sample by irradiation with the focused ion beam or the electron beam, and comprising:

reading identification information attached to the sample holder;

storing holder shape information indicating correspondence between the identification information and a shape of the sample holder, and design information that is shape information of an internal structure of the sample chamber; and limiting a driving range of the stage supporting the sample holder, based on the identification information read in the step of reading the identification information, the shape of the sample holder acquired from the holder shape information, and a shape of the internal structure.

* * * * *